United States Patent
Malinowski

(10) Patent No.: US 9,817,427 B2
(45) Date of Patent: Nov. 14, 2017

(54) STATIC OFFSET REDUCTION IN A CURRENT CONVEYOR

(71) Applicant: Dialog Semiconductor GmbH, Kirchheim/Teck-Nabern (DE)

(72) Inventor: Slawomir Malinowski, Graz-Seiersberg (AT)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 18 days.

(21) Appl. No.: 14/944,607

(22) Filed: Nov. 18, 2015

(65) Prior Publication Data

US 2016/0070291 A1 Mar. 10, 2016

Related U.S. Application Data

(63) Continuation of application No. 14/174,968, filed on Feb. 7, 2014, now Pat. No. 9,310,824.

(30) Foreign Application Priority Data

Feb. 13, 2013 (EP) ..................................... 13155105

(51) Int. Cl.
*G05F 3/02* (2006.01)
*G05F 3/26* (2006.01)
(Continued)

(52) U.S. Cl.
CPC ......... *G05F 3/262* (2013.01); *G01R 19/0092* (2013.01); *G05F 3/02* (2013.01);
(Continued)

(58) Field of Classification Search
CPC ... G05F 3/262; G05F 3/26; G05F 3/02; G01R 19/0092; H03K 17/082; H03K 2217/0027; H02M 2001/0009
See application file for complete search history.

(56) References Cited

U.S. PATENT DOCUMENTS

| 8,487,692 B1 * | 7/2013 | Chen ..................... H03K 17/164 327/538 |
| 2012/0200960 A1 | 8/2012 | Mueller |
| 2012/0293239 A1 * | 11/2012 | Fort ......................... G05F 3/30 327/513 |

OTHER PUBLICATIONS

"A Monolithic Current-Mode DC-DC Converter With On-Chip Current-Sensing Technique," by Cheung Fai Lee et al., IEEE Journal Journal of Solid-State Circuits, vol. 39, No. 1, Jan. 2004, pp. 3-14.

(Continued)

*Primary Examiner* — Jung Kim

(74) *Attorney, Agent, or Firm* — Saile Ackerman LLC; Stephen B. Ackerman

(57) ABSTRACT

A voltage mirror circuit, having an input node and an output node provides substantially equal voltage levels at the input node and the output node. The voltage mirror circuit comprises an input current source transistor, an input gain transistor arranged in series with the input current source transistor such that the input gain transistor is traversed by the bias current, wherein the voltage level at the input node corresponds to the voltage drop across the input current source transistor and the input gain transistor. An intermediate gain transistor forms a first current mirror with the input gain transistor. An output current source transistor forms a second current mirror with the intermediate current source transistor. The voltage level at the output node corresponds to the voltage drop across the output current source transistor and the output gain transistor.

9 Claims, 10 Drawing Sheets

(51) Int. Cl.
*G01R 19/00* (2006.01)
*H03K 17/082* (2006.01)
*H02M 1/00* (2006.01)

(52) U.S. Cl.
CPC ............ *G05F 3/26* (2013.01); *H03K 17/082* (2013.01); *H02M 2001/0009* (2013.01); *H03K 2217/0027* (2013.01)

(56) References Cited

OTHER PUBLICATIONS

"On-Chip Current Sensing Technique for CMOS Monolithic Switch-Mode Power Converters," by Cheung Fai Lee et al., IEEE Int. Symp. Circuits and Systems, vol. 5, Scottsdale, AZ, May 2002, pp. 265-268.

"Current-Sensing Techniques for DC-DC Converters," by Hassan Pooya Forghani-Zadeh et al., 2002 IEEE, Circuits and Systems, MWSCAS-2002, The 2002 45th Midwest Symposium, Aug. 4, 2002, pp. 577-580.

Power CMOS and BCD Linear Amplifier Design, Vadim Ivanov, MEAD training, EPFL, Lausanne, Aug. 30, 2004, pp. 1-2.

\* cited by examiner

STATIC OFFSET REDUCTION IN A CURRENT CONVEYOR

This is a Continuation application of U.S. Ser. No. 14/174,968, filed on Feb. 7, 2014, "Static Offset in a Current Conveyer", assigned to the same assignee as the present invention, and which is herein incorporated by reference in its entirety.

TECHNICAL FIELD

The present document relates to current conveyers. In particular, the present document relates to a current sensing circuit with reduced offset.

BACKGROUND

In Switch-mode power converters (SMPC), current-mode pulse width-modulation (PWM) control and current-limited pulse-frequency-modulation (PFM) control schemes are widely used due to their fast dynamic response and automatic overcurrent protection. Both control schemes make use of the inductor current (e.g. of the Buck/Boost power stage) to modify the pulse width in PWM or oscillation frequency in PFM for voltage regulation. The inductor current is particularly important for PWM, as the signal sensed from the inductor current is combined with the artificial ramp signal in order to avoid sub harmonic oscillation in current-mode control PWM converters.

Regardless of the type of feedback control, almost all DC-DC converters and linear regulators sense the inductor current for overcurrent (overload) protection. Additionally, the sensed current is used in current-mode control DC-DC converters for loop control. Conventional current sensing methods insert a resistor in the path of the current to be sensed. However, this method incurs significant power losses, especially when the current to be sensed is high. Lossless current-sensing methods address this issue by sensing the current without dissipating the power using a passive resistor.

In the present document, a current sensing circuit is described which allows for a lossless sensing of the inductor current, i.e. of the current through the power switch of a DC-DC converter. The current sensing circuit described in the present document can be integrated on-chip, jointly with the DC-DC converter. Other applications of the current sensing circuit are e.g. fast switching, well controlled active current sources, amplifier/LDO (Low Dropout Regulator) overcurrent detection/protection circuits.

SUMMARY

According to an aspect, a voltage mirror circuit (also referred to as a current conveyer circuit) is described. The voltage mirror circuit may be configured to provide substantially equal voltage levels at an input node and at an output node. In other words, the voltage mirror circuit may be configured to reduce an offset between the voltage level at the input node and the voltage level at the output node. In yet other words, the voltage mirror circuit may be configured to compensate possible channel length modulation effects incurred by the transistors comprised within the voltage mirror circuit. The voltage mirror circuit may be used e.g. to provide a (possibly lossless) current sensing circuit and/or to provide a current source having a relatively high bandwidth.

The voltage mirror circuit comprises an input current source transistor configured to provide a bias current. The bias current may be generated using a current source. In particular, the voltage mirror circuit may comprise or may be coupled to a current source configured to provide a pre-determined current. A mirror transistor arranged in series with the current source may be used to mirror the pre-determined current to the input current source transistor, thereby providing the bias current. In particular, the mirror transistor may be arranged such that it is traversed by the pre-determined current. Furthermore, the mirror transistor may form a current mirror with the input current source transistor, thereby providing the bias current as the drain-source current of the input current source transistor.

The voltage mirror circuit may further comprise an input gain transistor arranged in series with the input current source transistor. The input gain transistor may be arranged such that the input gain transistor is traversed by the bias current. The voltage level at the input node may correspond to the voltage drop across the input current source transistor and the input gain transistor. In other words, the voltage level at the input node may be defined by the voltage drop across the input current source transistor and the input gain transistor.

In addition, the voltage mirror transistor may comprise an intermediate gain transistor which forms a first current mirror with the input gain transistor, thereby providing an intermediate current. A first mirror factor of the first current mirror may be given by N. The mirror factor may be implemented by an appropriate aspect ratio of the input gain transistor and the intermediate gain transistor. As a result of the first mirror factor, the intermediate current may be N times the bias current.

The voltage mirror transistor may further comprise an intermediate current source transistor arranged in series with the intermediate gain transistor. The intermediate current source transistor may be arranged such that the current through the intermediate current source transistor corresponds to the current through the intermediate gain transistor (i.e. to the intermediate current). Furthermore, the voltage mirror transistor may comprise an output current source transistor which forms a second current mirror with the intermediate current source transistor, thereby providing the output current through the output current source transistor. A second mirror factor of the second current mirror may be given by K. As such, the output current source transistor may be K times the intermediate current.

The voltage mirror circuit may comprise an output gain transistor arranged in series with the output current source transistor. The output gain transistor may be arranged such that the current through the output current source transistor (i.e. the output current) corresponds to the current through the output gain transistor. The output gain transistor may further be arranged such that it forms a third current mirror with the input gain transistor. A third mirror factor of the third current mirror may be given by M. As such, the output current (through the output gain transistor) may be M times the bias current. At the same time, the output current may be K times the intermediate current which may be N times the bias current. Hence, the second mirror factor K may be equal to the ratio of the third mirror factor M and the first mirror factor N, i.e. K=M/N.

The voltage level at the output node may correspond to the voltage drop across the output current source transistor and the output gain transistor. In other words, the voltage level at the output node may be defined by the voltage drop across the output current source transistor and the output gain transistor. As a result of the particular arrangement of the current source transistors and the gain transistors described above, it is ensured that an offset between the voltage level at the output node and the voltage level at the input node is reduced.

The voltage mirror circuit may further comprise an output transistor arranged such that a drain-source voltage of the output transistor corresponds to the voltage level at the output node. In other words, the output transistor may be arranged in parallel to the serial arrangement of the output gain transistor and the output current source transistor. The output transistor may be arranged such that a gate-source voltage of the output transistor corresponds to a drain-source voltage of the output current source transistor. For this purpose, the gate of the output transistor may be coupled to the drain of the output current source transistor. Furthermore, a threshold voltage (corresponding to the gate-source voltage which puts the respective transistor in the on-state) of the intermediate current source transistor may be substantially equal to a threshold voltage of the output transistor. By doing this, it can be ensured that the drain-source voltage of the intermediate current source transistor is substantially equal to the drain-source voltage of the output current source transistor, thereby reducing a channel length modulation effect in the second current mirror.

A gate and a drain of the input gain transistor may be short circuited and directly coupled to a gate and a drain of the intermediate gain transistor (wherein the gate and the drain of the intermediate gain transistor are also short circuited). At the same time, the sources of the input gain transistor and the intermediate gain transistor may be directly coupled. As a result, it is ensured that the drain-source voltage of the input gain transistor and the drain-source voltage of the intermediate gain transistor are substantially equal, thereby reducing a channel length modulation effect in the first current mirror.

A gate of the input gain transistor and a gate of the intermediate gain transistor and a gate of the output gain transistor may be directly coupled (thereby forming the first and third current mirrors). Furthermore, a gate of the intermediate current source transistor and a gate of the output current source transistor may be directly coupled. In addition, the gate of the intermediate current source transistor may be coupled to a drain of the intermediate current source transistor (thereby forming the second current mirror).

As indicated above, the input gain transistor and the input current source transistor may be arranged in series. In particular, a drain of the input current source transistor may be directly coupled to a drain of the input gain transistor. In a similar manner, the intermediate gain transistor and the intermediate current source transistor may be arranged in series. In particular, a drain of the intermediate current source transistor may be directly coupled to a drain of the intermediate gain transistor. Furthermore, the output gain transistor and the output current source transistor may be arranged in series. In particular, a drain of the output current source transistor may be directly coupled to a drain of the input gain transistor.

The transistors of the voltage mirror circuit may be metal oxide semiconductor field effect transistors (MOSFETs). In particular, the gain transistors may be P-channel transistors, e.g. PMOS transistors, the current source transistors may be N-channel transistors, e.g. NMOS transistors, and/or the output transistor may be an N-channel transistor, e.g. an NMOS transistor.

The sources of the current source transistors may share a common potential, e.g. ground. Furthermore, the sources of the input gain transistor and of the intermediate gain transistor may be directly coupled and may correspond to the input node. In a similar manner, the source of the output gain transistor may correspond to the output node.

According to a further aspect, a current sensing circuit configured to provide an indication of a current through a first resistance is described. The first resistance may e.g. correspond to the on-resistance of a power transistor (e.g. the power transistor of a DC/DC converter). The current sensing circuit may comprise a voltage mirror circuit as described in the present document. The input node of the voltage mirror circuit may be directly coupled to a first end of the first resistance. Furthermore, the current sensing circuit may comprise a second resistance (e.g. the on-resistance of a second transistor). A first end of the second resistance may be directly coupled to the output node of the voltage mirror circuit and a second end of the second resistance may be directly coupled to a second end of the first resistance. The voltage mirror circuit ensures that the current through the second resistance provides the indication of (e.g. is proportional to) the current through the first resistance. Typically, the second resistance is significantly larger (e.g. three or more orders of magnitude larger) than the first resistance.

The first resistance may provide a load current to a load arranged in parallel to the serial input gain transistor and input current source transistor of the voltage mirror circuit. The load current may represent a coil current in case of a DC/DC converter, and/or the load current in case of an LDO (Low Drop-out Regulator). As indicated above, the voltage mirror circuit may comprise an output transistor arranged in parallel to the serial output gain transistor and output current source transistor. As such, the current through the output transistor of the voltage mirror circuit may provide an indication of (e.g. may be proportional to) the load current.

According to another aspect, a current source configured to provide a sink current is described. The current source may be configured to be switched on/off at a relatively high frequency. The current source may comprise a first resistance. Furthermore, the current source may comprise a voltage mirror circuit as described in the present document. The input node of the voltage mirror circuit may be directly coupled to a first end of the first resistance. As described above, the voltage mirror circuit may comprise an output transistor arranged in parallel to the serial output gain transistor and output current source transistor. Furthermore, the current source may comprise a second resistance. A first end of the second resistance may be directly coupled to the output node of the voltage mirror circuit. A second end of the second resistance may be directly coupled to a second end of the first resistance. The output transistor may provide the sink current as a drain-source current of the output transistor.

According to another aspect, a method for aligning a voltage level at an output node with a voltage level at an input node is described. In other words, the method may be directed at reducing an offset between the voltage level at the output node with respect to the voltage level at the input node. The method may comprise providing a bias current using an input current source transistor. Furthermore, the method may comprise providing the bias current to an input gain transistor arranged in series with the input current source transistor. The voltage level at the input node typically corresponds to the voltage drop across the input current source transistor and the input gain transistor. The method may comprise mirroring the bias current from the input gain transistor to an intermediate gain transistor, thereby yielding the intermediate current. Furthermore, the method may comprise providing the intermediate current to an intermediate current source transistor arranged in series with the intermediate gain transistor. In addition, the method may comprise mirroring the intermediate current from the intermediate current source transistor to an output current source transistor, thereby yielding the output current. The output current may be provided to an output gain transistor arranged in series with the output current source transistor. The voltage level at the output node may correspond to the voltage drop across the output current source transistor and the output gain transistor.

According to a further aspect, a software program is described. The software program may be adapted for execution on a processor and for performing the method steps outlined in the present document when carried out on the processor.

According to another aspect, a storage medium is described. The storage medium may comprise a software program adapted for execution on a processor and for performing the method steps outlined in the present document when carried out on the processor.

According to a further aspect, a computer program product is described. The computer program may comprise executable instructions for performing the method steps outlined in the present document when executed on a computer.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

SHORT DESCRIPTION OF THE FIGURES

The invention is explained below in an exemplary manner with reference to the accompanying drawings.

DETAILED DESCRIPTION

As outlined in the background section, the present document describes current sensing circuits, in particular lossless current sensing circuits which may be used as current sensing circuits for DC/DC converters, for fast switching, as well as for controlled active current sources, and/or for amplifier/LDO overcurrent detection/protection circuits.

The current sensing circuit is described in the following for sensing the current through the high side switch of a DC/DC converter. It should be noted that the current sensing circuit can be extended to sense low side devices by providing a complementary circuit (see FIG. 2b) to be used for other topologies.

Figure 1A:
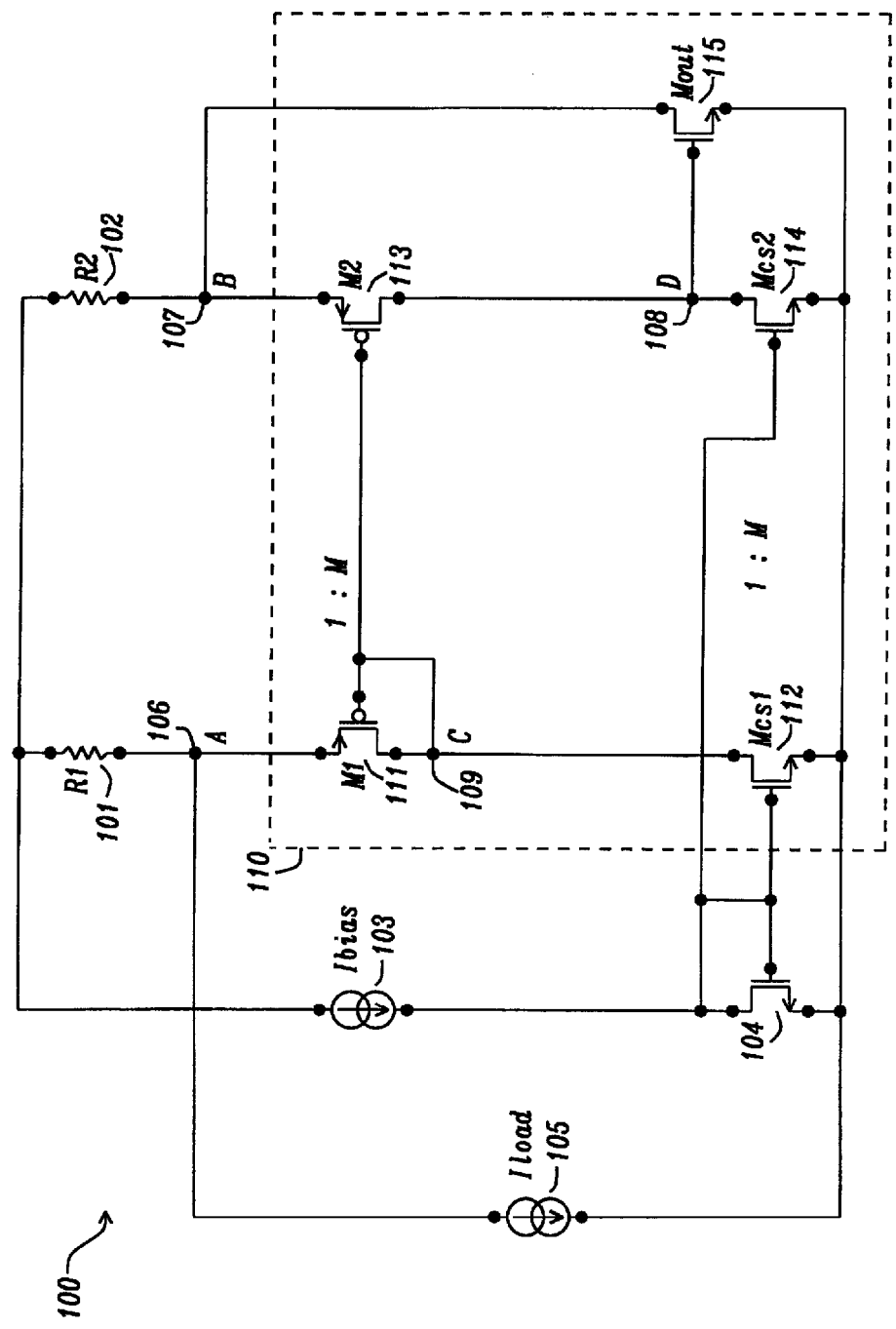
FIGS. 1a to 1c illustrate example current sensing circuits.
Figure 1B:
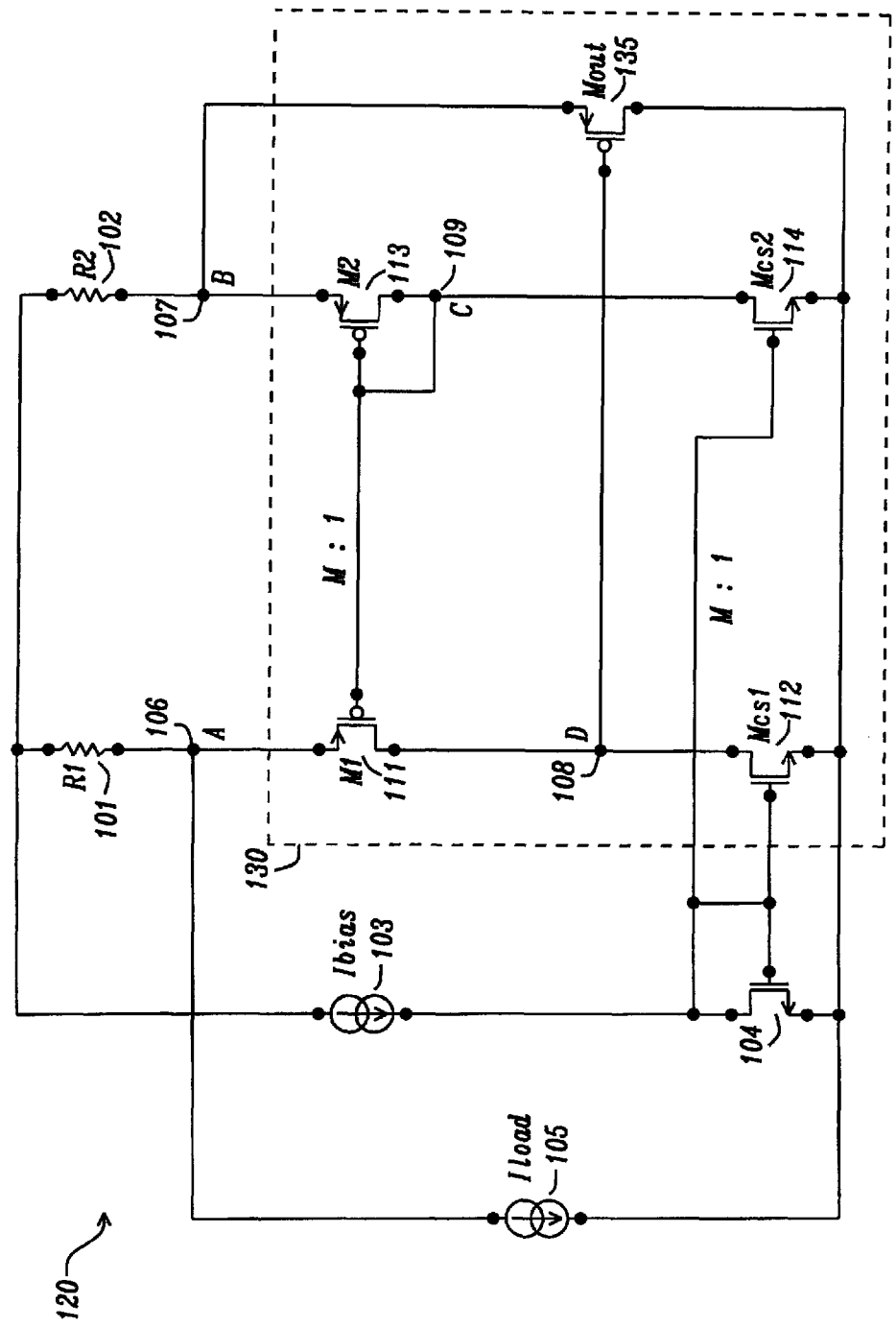
Figure 1C:
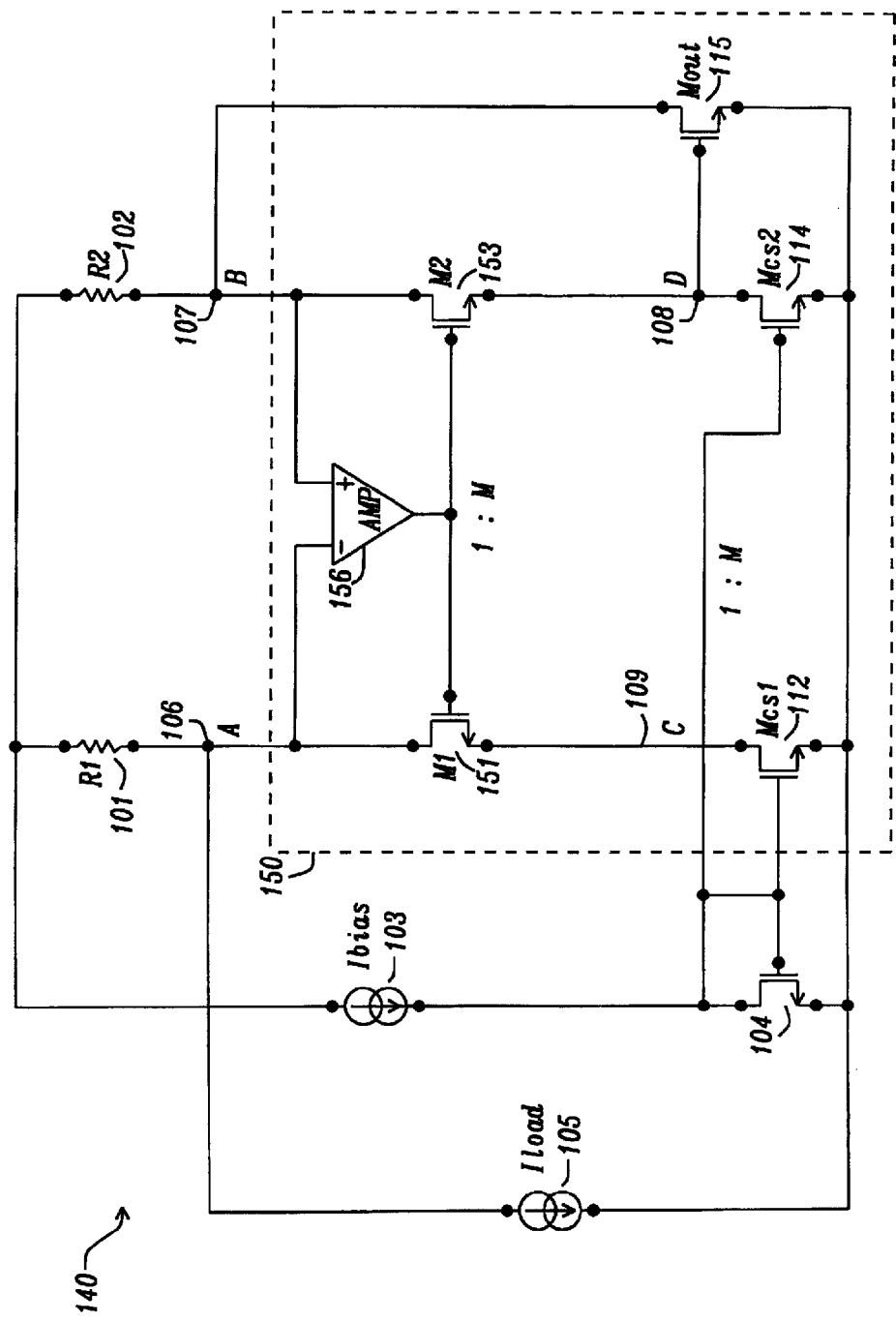

As will be outlined in the context of FIGS. 1a to 1c, conventional current sensing circuits exhibit various disadvantages. In particular, significant static offsets may be introduced by channel length modulation effects (as is the case for the circuit shown in FIG. 1a), and/or the circuits may provide strongly decreased open loop gains and/or exhibit increased circuit areas (as is the case for the circuit shown in FIG. 1b), and/or the circuits may have a complex architecture and may require a significantly higher minimum supply voltage, an increased circuit area and an increased current consumption (as is the case for the circuit shown in FIG. 1c).

The current sensing circuit described in the present document addresses these technical problems. In particular, the described current sensing circuit yields a static offset reduction, maintains a relatively high gain bandwidth and a relatively high open loop gain, and may be operated with a relatively low minimum supply voltage. The current sensing circuit may be implemented at reduced cost and makes use of an internal feed-forward. In particular, no additional amplifiers and/or loops which require compensation are introduced.

FIG. 1a shows the circuit diagram of an example current sensing circuit 100. The current sensing circuit 100 comprises the resistors R1 101 and R2 102 which represent the on-resistances Ron of the high side transistor of a DC-DC converter (R1 101), when in on-state, and the on-resistances Ron of a mirror transistor (R2 102). Typically, R2 102 is significantly larger than R1 101 (e.g. R2=1000 times R1), which can be implemented by using transistors having different aspect ratios (e.g. different widths). By doing this, the losses of the current sensing circuit 100 can be reduced.

The current sensing circuit 100 further comprises a voltage mirror or a current conveyer 110. The voltage mirror 110 comprises current sources using the transistors Mcs1 112 and Mcs2 114 (also referred to as current source transistors) and gain stages using the transistors M1 111 and M2 113 (also referred to as gain transistors). The $V_{DS}$ voltage of the $M_{CS1}$ transistor 112 is close to the supply voltage minus the $V_{GS}$ voltage of the $M_1$ transistor 111 (by way of example, for a 5V supply voltage, the $V_{DS}$ voltage of the $M_{CS1}$ transistor 112 is above 4V). On the other hand, the $V_{DS}$ voltage of the $M_{CS2}$ transistor 114 is equal to the $V_{GS}$ voltage of the $M_{out}$ transistor 115 (e.g. around 1V). Due to the channel length modulation (CLM) effect of metaloxide semiconductor field effect transistors (MOSFET) illustrated in FIG. 3a, the different $V_{DS}$ voltage at the transistors 112, 114 leads to a difference in the current through the transistors 112 and 114. In other words, the difference in $V_{DS}$ voltage has an effect on the current generated by both current sources 112, 114.

The current generated within the current sources is stimulated by the bias current provided by the bias current source 103 and mirrored onto the $M_{CS1}$ transistor 112 using the current mirror formed by the bias current transistor 104 and the $M_{CS1}$ transistor 112. In a similar manner, the bias current provided by the bias current source 103 is mirrored onto the $M_{CS2}$ transistor 114 using the current mirror formed by the bias current transistor 104 and the $M_{CS2}$ transistor 114.

Within the gain stage, the $V_{DS}$ voltage of the $M_1$ transistor 111 is equal to its $V_{GS}$ voltage (e.g. around 1 V) and the $V_{DS}$ voltage of the $M_2$ transistor 113 is close to the supply voltage minus the $V_{GS}$ voltage of the $M_{out}$ transistor 115 (e.g. for a 5V supply voltage, the $V_{DS}$ voltage of the $M_2$ transistor 113 is above 4V). This difference has an effect on the current flowing in both transistors 111, 113. In other words, due to the channel length modulation (CLM) effect, the different $V_{DS}$ voltages of the gain transistors 111, 113 yield a different current flowing through the gain transistors 111, 113.

As such, the CLM effect introduces errors at the current sources and the gain stages of the voltage mirror 110. These errors cause a higher voltage at the node "D" 108 (compared to the voltage at the node "C" 109), i.e. at the gate of the $M_{out}$ transistor 115. This induces the voltage at node "B" 107, i.e. at the drain of the $M_{out}$ transistor 115 to be reduced and to be smaller than the voltage at node "A" 106 (i.e. the voltage at the source of the $M_1$ transistor 111). However, in order to provide a correct indication of the current through the resistor R2 101, the voltage at the nodes "A" 106 and "B" 107 should be equal. In particular, a feedback loop of the DC-DC converter typically controls the current flowing through the resistor $R_2$ 101 under the assumption that the voltages in nodes "A" 106 and "B" 107 are the same.

As such, the current sensing circuit 100 of FIG. 1a introduces a relatively large static offset which is caused by the channel length modulation effect. This offset also depends on the level of the supply voltage.

The offset may be reduced e.g. by using cascode transistors (typically comprising two or more transistors) in the current source and gain stage (for the transistors 111, 112, 113, 114). However, the use of cascode transistors typically strongly reduces the bandwidth of the amplifier and increases the required minimum supply voltage of the current sensing circuit, as well requires increased silicon area.

FIG. 1b illustrates a current sensing circuit 120 comprising a voltage mirror 130 using a PMOS transistor as an output transistor $M_{out}$ 135 (instead of an NMOS transistor 115 used in circuit 100). The gate of the PMOS transistor 135 (node "D" 108) is coupled to the drain of the $M_{CS1}$ transistor 112 (instead of the drain of the $M_{CS2}$ transistor 114). In this case, the voltages at the nodes "D" 108 and "C" 109 are close to each other, thereby causing the $V_{DS}$ voltages of the $M_{CS1}$ transistor 112 and of the $M_{CS2}$ transistor 113 to be the same. In a similar manner, the $V_{DS}$ voltages of the $M_1$ transistor 111 and of the $M_2$ transistor 113 are the same. Hence, the current sensing circuit 120 does not exhibit an offset. However, the disadvantage of this solution is a reduced open loop gain, because the output transistor 135 is working as a voltage follower and has a gain of 0 dB. Due to changes of the voltage in node "C" 109 subject to changing $I_{load}$ current 105, the size of the output PMOS transistor 135 typically has to be significantly larger than the NMOS transistor 113. As a result, the circuit area of the output transistor 135 is significantly increased and the bandwidth of the current sensing circuit is decreased.

FIG. 1c shows the circuit diagram of another example current sensing circuit 140. The voltage mirror 150 of FIG. 1c comprises an additional amplifier 156 (e.g. an operational amplifier) which is used to minimize the channel length modulation effect. The $M_1$ and $M_2$ transistors are implemented as NMOS transistors 151, 153 (instead of PMOS transistors). This makes the voltages at the nodes "C" 109 and "D" 108 the same. In this case, the current sources (i.e. the $M_{CS1}$ and $M_{CS2}$ transistors 112, 114) are delivering the same current.

The solution of FIG. 1c has various drawbacks. The offset seen between nodes "A" 106 and "B" 107 is determined by the offset of the amplifier 156 and the open loop gain of the amplifier 156. The bandwidth of the loop may be strongly reduced if the amplifier 156 is a standard OTA (Operational Transconductance Amplifier), as voltage amplifiers typically have a much smaller bandwidth than current amplifiers. Furthermore, the current sensing circuit 140 of FIG. 1c typically requires an increased current consumption. In addition, the minimum supply voltage required for operating the current sensing circuit 140 is higher than for the circuits 100, 120 of FIGS. 1a and 1b.

Figure 2A:
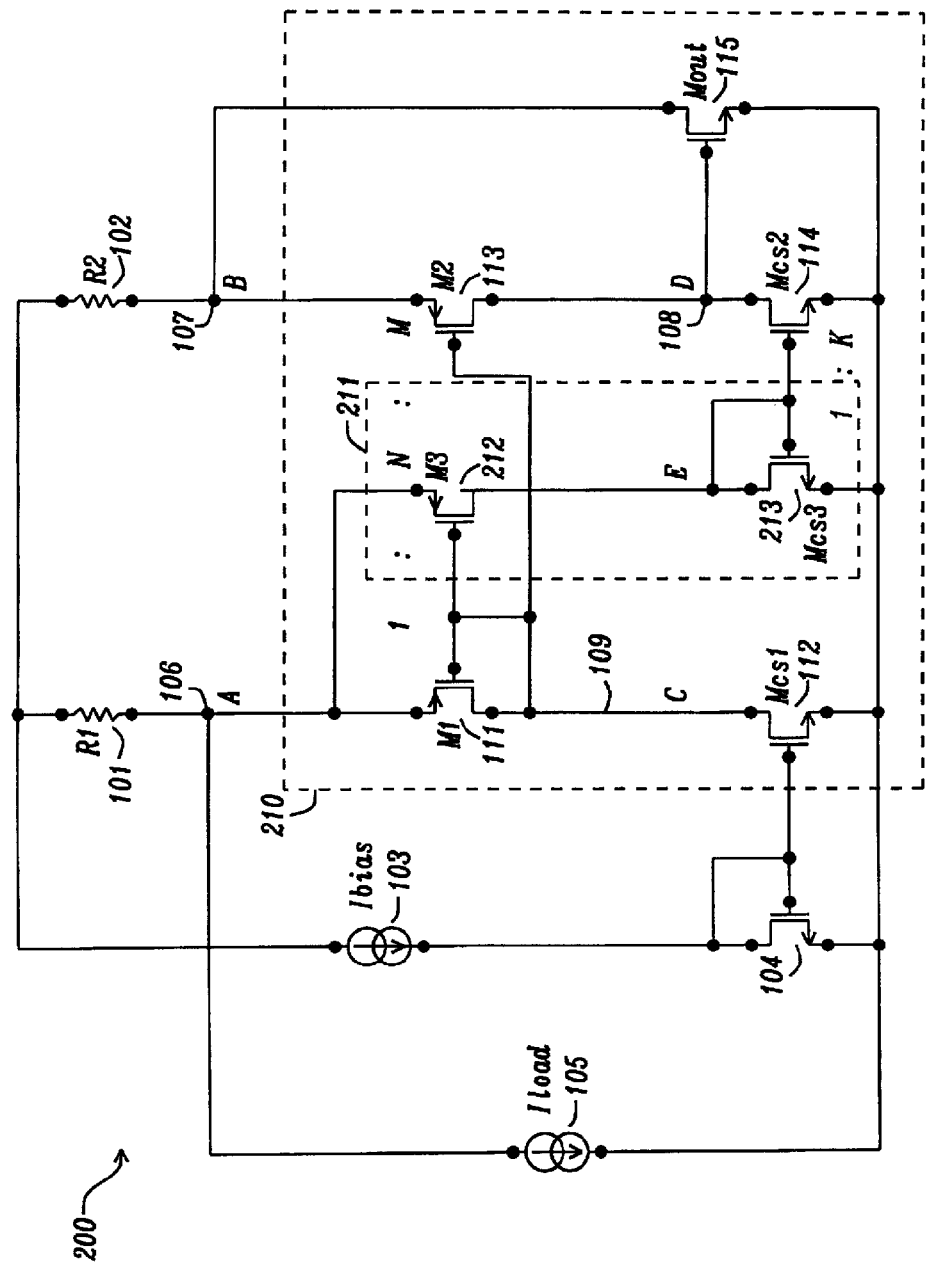
FIGS. 2a to 2c show circuit diagrams of example current sensing circuits with reduced offset.

In the present document, it is proposed to make use of an offset compensation circuit to remove the offset incurred by the current sensing circuit 100 of FIG. 1a. As a result of such an offset compensation circuit, a current sensing circuit may be provided, which exhibits a reduced static offset, a relatively high gain bandwidth and a relatively high open loop gain, and which may be operated at relatively low supply voltages. An example current sensing circuit 200 comprising an offset compensation circuit 211 is illustrated in FIG. 2a. The offset compensation circuit 211 comprises the gain transistor $M_3$ 212 (also referred to as the intermediate gain transistor 212) and the current source transistor $M_{CS3}$ 213 (also referred to as the intermediate current source transistor 213). The dimensions of the gain transistor $M_3$ 212 and the current source transistor $M_{CS3}$ 213 are preferably selected such that the mirror factor between the gain transistors $M_3$ 212 and $M_2$ 113 is the same as between the current source transistors $M_{CS3}$ 213 and $M_{CS2}$ 114. i.e. $1/K=N/M$. Furthermore, the current source transistors $M_{CS3}$ 213 and $M_{CS2}$ 114 are preferably chosen in a way that the $V_{GS}$ voltage of the transistor $M_{CS3}$ 213 is close to the $V_{GS}$ voltage of the $M_{out}$ transistor 115.

Notably when using the above mentioned dimensions, the $V_{DS}$ voltages of the current source transistors $M_{CS3}$ 213 and $M_{CS2}$ 114 are close to each other and by consequence, the channel length modulation effect is reduced. The current flowing in the gain transistor $M_3$ 212 is increased with respect to the current flowing in the gain transistor $M_1$ 111 due to the channel length modulation effect. This increased current is mirrored in the current mirror formed by the transistors $M_{CS2}$ 114 and $M_{CS3}$ 213. But because the \f$_{DS}$ voltage of the transistor $M_3$ 212 is close to the $V_{DS}$ voltage of the transistor $M_2$ 113, the channel length modulation effect in transistor $M_2$ 113 is compensated.

Figure 2B:
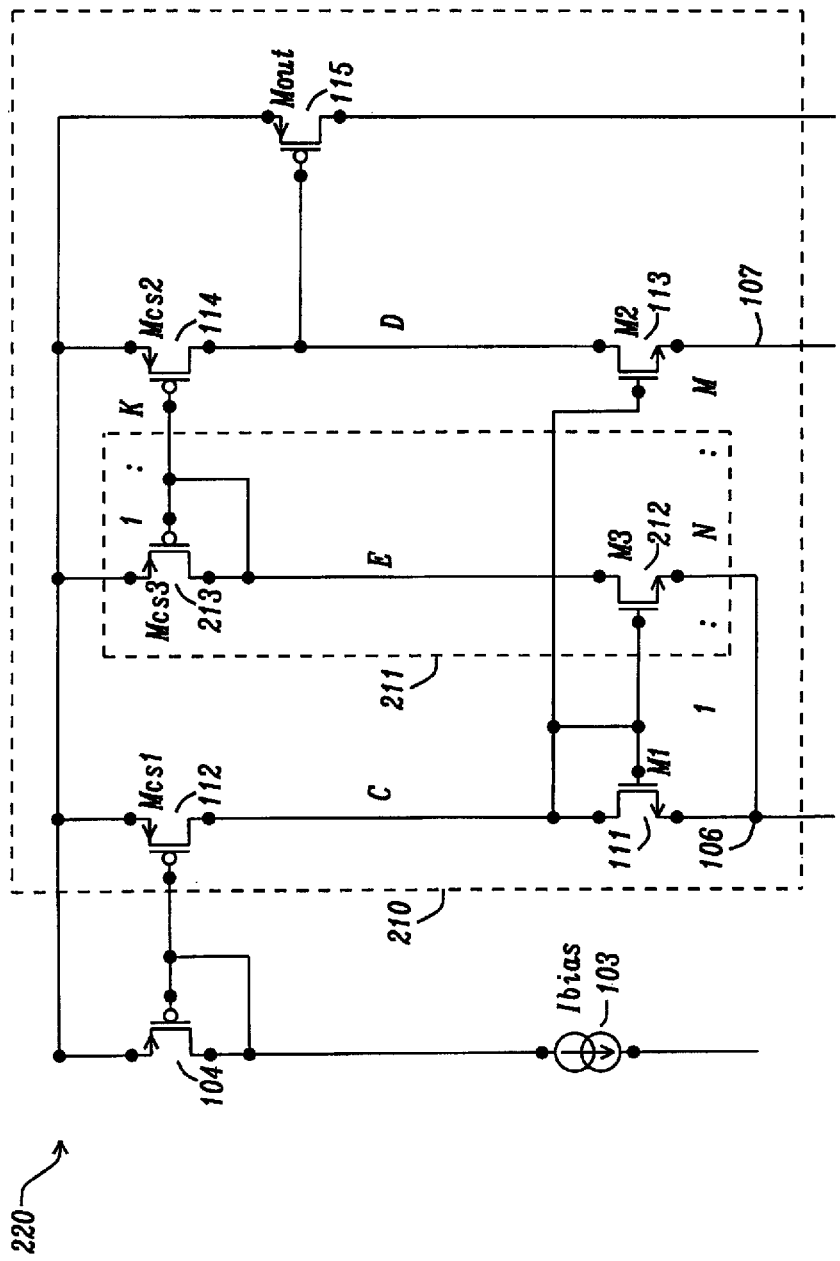

FIG. 2b illustrates a circuit diagram of a complementary current sensing circuit 220. In the complementary circuit, the nodes "A" 106 and "B" 107 are at the bottom of the circuit 220. The current sensing circuit 220 is configured to sense the current through node "A" 106. The current sensing circuit 220 may be used to sense the current through the low side switch of a half bridge (used e.g. in a DC/DC converter).

Figure 2C:
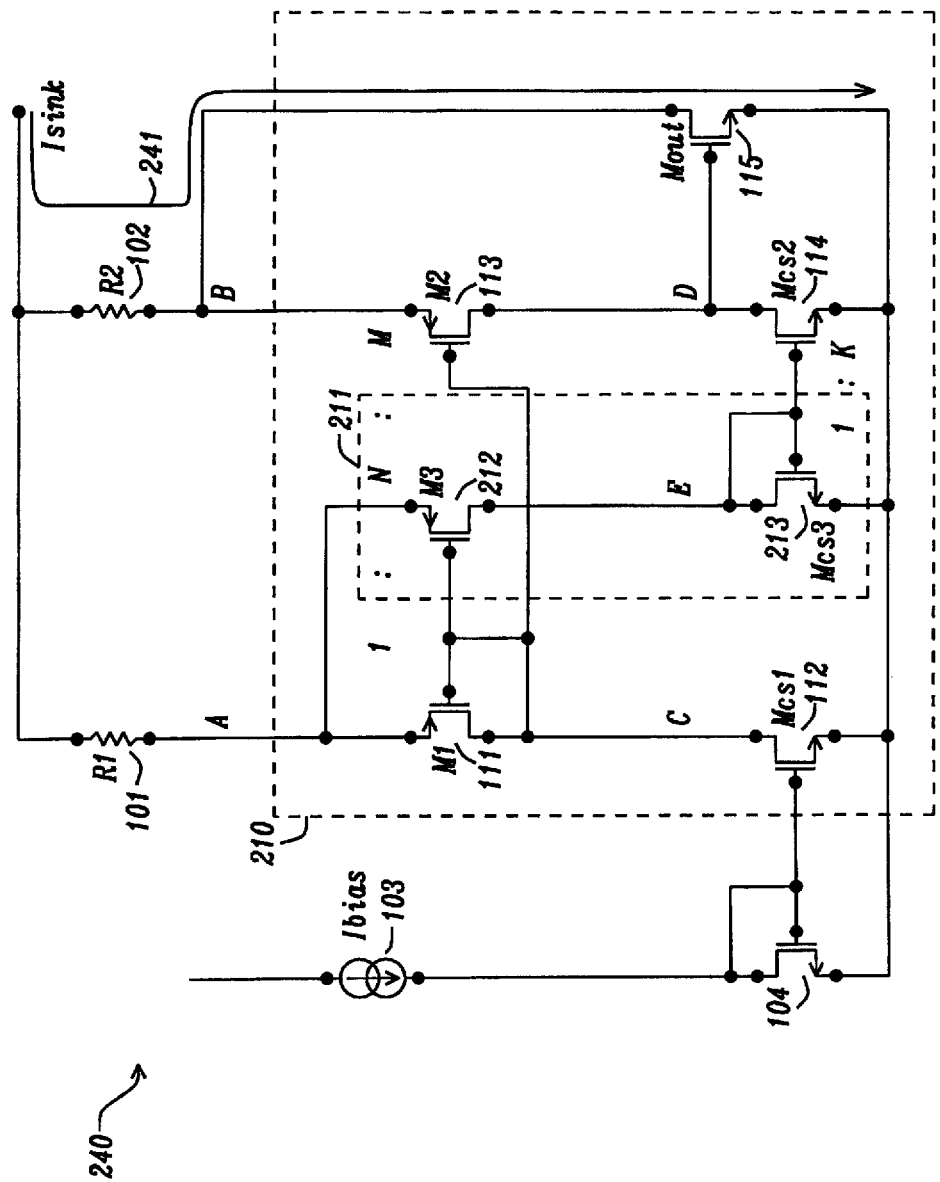

FIG. 2c illustrates a circuit diagram of an example active current source 240 which is configured to provide a current Isink 241. The current source 240 is configured to switch between an on-state and an off-state very rapidly.

Figure 3A:
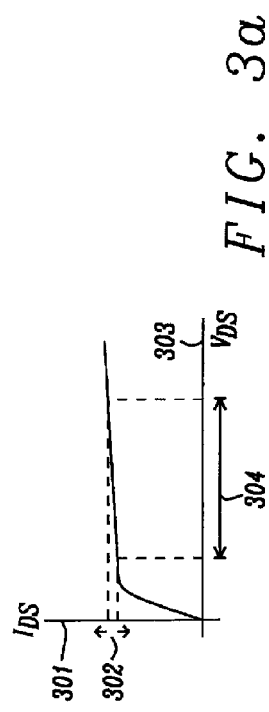
FIG. 3a illustrates the effects of channel length modulation on the drain-source current of a transistor.

As indicated above, FIG. 3a illustrates the channel length modulation effect. FIG. 3a shows the drain-source current $I_{DS}$ 301 through a transistor as a function of the drain-source voltage $V_{DS}$ 303. It can be seen that the drain-source current $I_{DS}$ varies in the interval 302, subject to the drain-source voltage $V_{DS}$ varying in the interval 304.

Figure 3B:
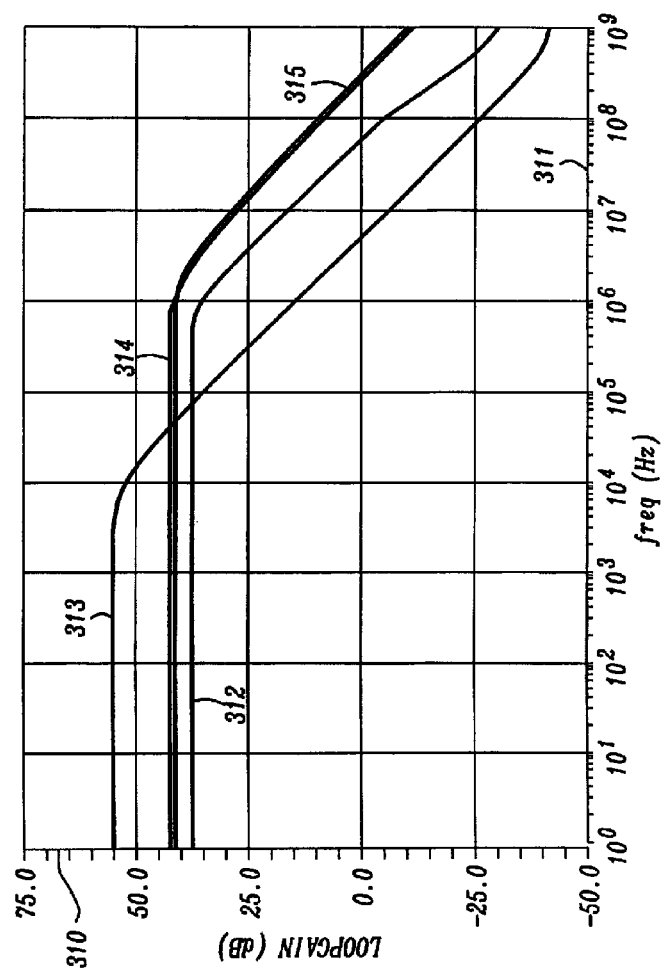
FIGS. 3b to 3d illustrate various example experimental results.
Figure 3C:
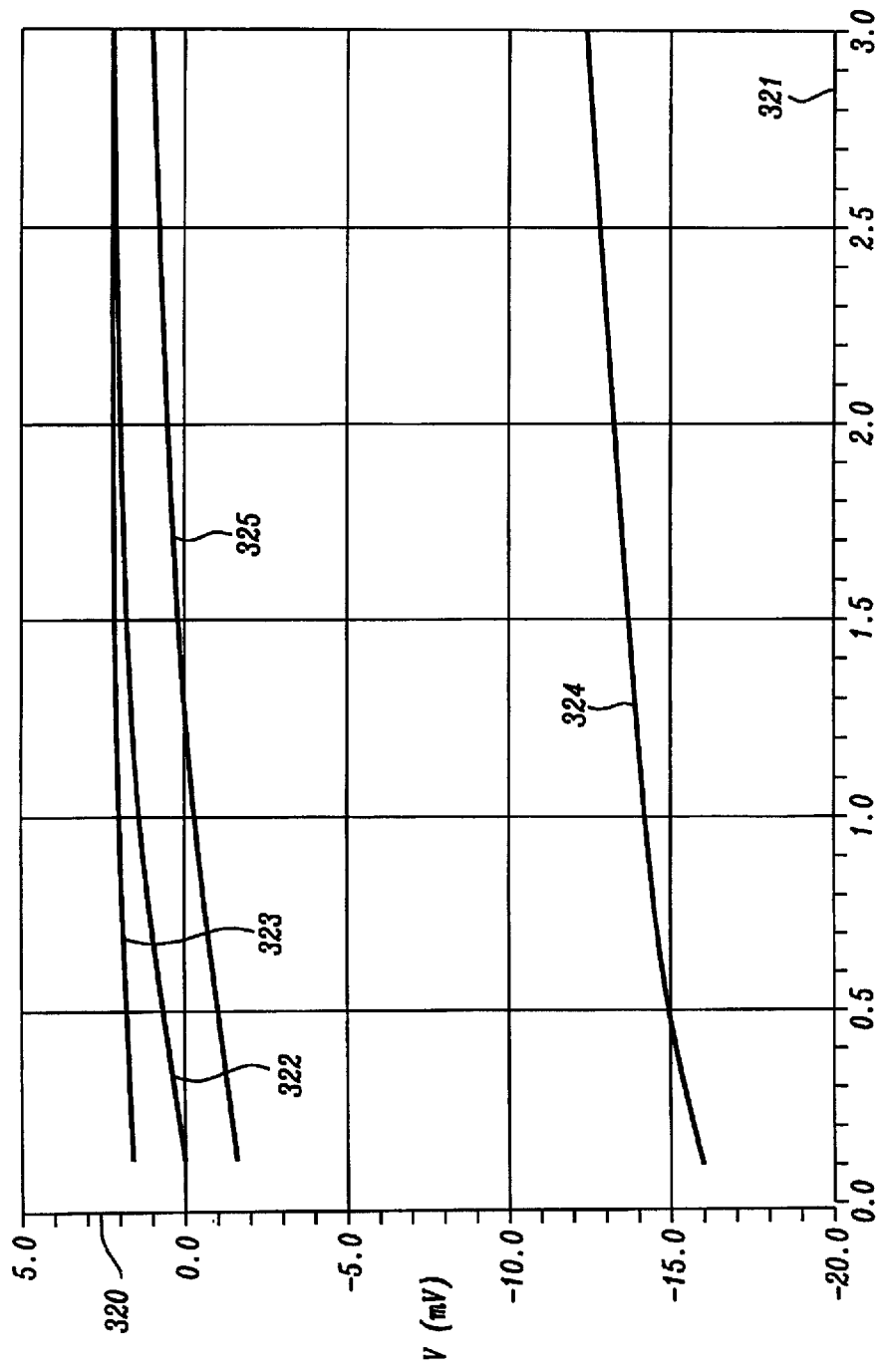
Figure 3D:
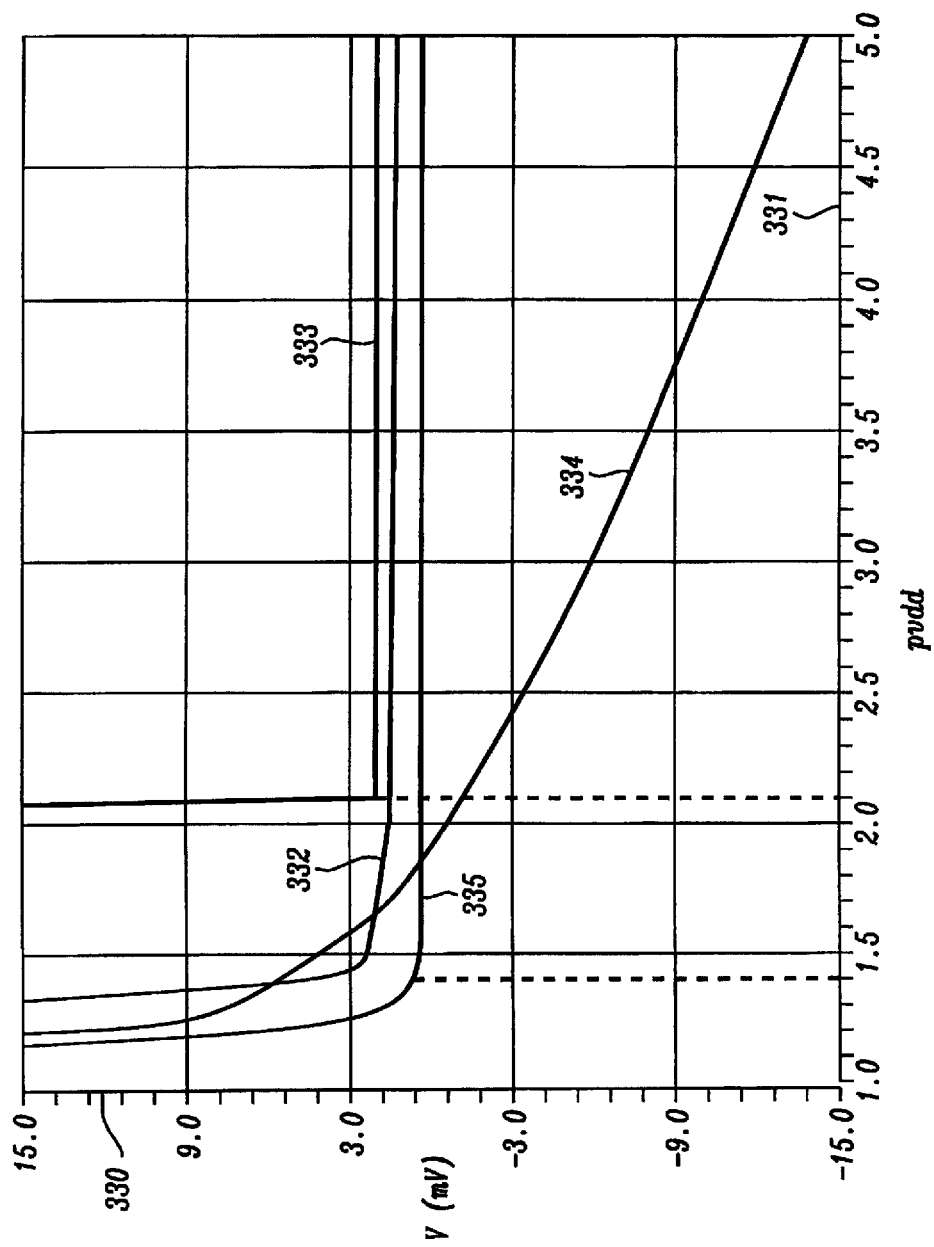

FIGS. 3b to 3d illustrate various experimental results for the current sensing circuits illustrated in FIGS. 1a to 1c and 2a. All circuits 100, 120, 140, 200 have been designed with 5V transistors in CMOS 130 nm technology. For the current sensing circuit 140 comprising an additional amplifier 156 the following parameters were taken: an open loop DC gain of 60 dB and a bandwidth of 10 MHz. In all circuits, the resistor value ratio between R1 101 and R2 102 was 1 to 1000.

FIG. 3b shows a comparison of the open loop gain 310 of the different circuits, which was performed with a 5V supply voltage and a 1A load current $I_{load}$ 105. FIG. 3b shows the open loop gain 310 as a function of frequency 311. It can be seen that the bandwidth of the circuit 200 (curve 315) is similar to the bandwidth of the circuit 100 (curve 314) and significantly improved compared to the bandwidths of the circuits 120 (curve 312) and 140 (curve 313). In particular, the proposed circuit 200 exhibits a bandwidth which is increased by around 25% compared to the bandwidth of circuit 140. This increased bandwidth is due to the increased output impedance in the $M_2$ and $M_{CS2}$ transistors 113, 114. On the other hand, the DC gain 310 of circuit 200 is decreased by less than 1 dB with respect to the circuit 100 of FIG. 1a.

FIG. 3c shows an offset 320 vs. load current 321 diagram. The simulations have been performed with a 5V supply voltage. It can be seen that the offset of the circuit 200 (curve 325) is significantly decreased compared to the offset of the circuit 100 (324), and similar to the offset of the circuits 120 (curve 322) and 140 (curve 323). As such, the derivative of the offset for the circuit 100 is in the same range as for the circuits 120 and 140, however, without the need of an additional amplifier and/or without using a PMOS output transistor. Furthermore, the static value is cancelled out.

FIG. 3d shows an example offset 330 vs. supply voltage 331 diagram. The simulations have been performed with a 1A load current. It can be seen that the circuit 200 (curve 335) is able to work with very small supply voltages. This is advantageous e.g. in mobile (battery supplied) devices which are regularly operated at relatively small supply voltages. Mobile devices are designed in a way to fully use up the electrical energy stored within a battery of the device, and by consequence the mobile devices are regularly operated at relatively low supply voltages. The simulations show that the offset (curve 335) of the circuit 200 is well controlled down to a supply voltage of 1.3V, whereas for the circuit 140 (curve 333) with additional amplifier, the minimum supply voltage is above 2.2V assuming that the voltage amplifier keeps its parameters for this voltage range. Furthermore, it can be seen that the circuit 100 (curve 334) shows a very strong offset voltage dependency for supply voltage changes. In addition, it can bee seen that the offset for circuit 200 (curve 335) is reduced compared to the offset of circuit 120 (curve 332).

Figure 4:
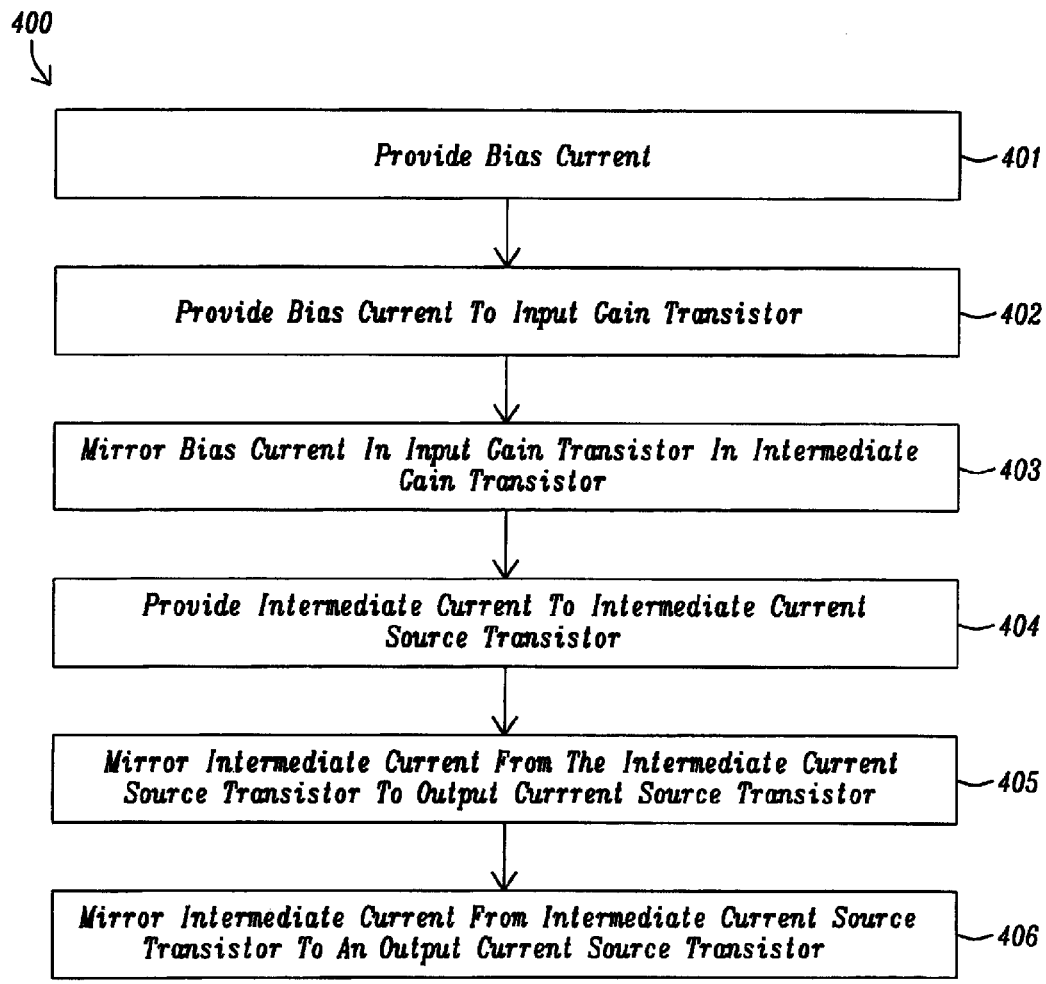
FIG. 4 shows the flow chart of an example method for mirroring a voltage.

FIG. 4 shows the flow chart of an example method 400 for mirroring a voltage level from an input node to an output node. In particular, the method 400 is directed at aligning the voltage level at the output node 107 with the voltage level at the input node 106. The method 400 comprises the step of providing 401 a bias current using an input current source transistor 112. Furthermore, the method 400 comprises providing 402 the bias current to an input gain transistor 111 arranged in series with the input current source transistor 112. Typically, the voltage level at the input node 106 corresponds to the voltage drop across the input current source transistor 112 and the input gain transistor 111. The method 400 may comprise mirroring 403 the bias current from the input gain transistor 111 to an intermediate gain transistor 212, thereby yielding the intermediate current. Furthermore, the method 400 may comprise providing 404 the intermediate current to an intermediate current source transistor 213 arranged in series with the intermediate gain transistor 212. In addition, the method 400 may comprise mirroring 405 the intermediate current from the intermediate current source transistor 213 to an output current source transistor 114, thereby yielding the output current. The method 400 may also comprise providing 406 the output current 406 to an output gain transistor 113 arranged in series with the output current source transistor 114. Typically, the voltage level at the output node 107 corresponds to the voltage drop across the output current source transistor 114 and the output gain transistor 113.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A current sensing circuit configured to provide an indication of a current through a first resistance, the first resistance having a first end and a second end, wherein the first end is coupled to an input node, the current sensing circuit comprising:

an input current source transistor configured to provide a bias current;

an input gain transistor arranged in series with the input current source transistor such that the serial input gain transistor is traversed by the bias current, wherein the voltage level at the input node corresponds to the voltage drop across the input current source transistor and the input gain transistor;

an intermediate gain transistor forming a first current mirror with the input gain transistor;

an intermediate current source transistor arranged in series with the intermediate gain transistor such that a current through the intermediate current source transistor corresponds to a current through the intermediate gain transistor;

an output current source transistor forming a second current mirror with the intermediate current source transistor; and an output gain transistor arranged in series with the output current source transistor such that a current through the output current source transistor corresponds to a current through the output gain transistor, wherein a voltage level at an output node corresponds to the voltage drop across the output current source transistor and the output gain transistor; wherein sources of the current source transistors share a common potential; wherein sources of the input gain transistor and of the intermediate gain transistor correspond to the input node; and wherein a source of the output gain transistor corresponds to the output node; wherein the first resistance provides a load current to a load arranged in parallel to the serial input gain transistor and input current source transistor; wherein the current sensing circuit comprises an output transistor arranged in parallel to the serial output gain transistor and output current source transistor; and wherein the current through the output transistor provides an indication of the load current.

2. The current sensing circuit of claim 1, wherein a drain to source voltage of the output transistor corresponds to the voltage level at the output node.

3. The current sensing circuit of claim 2, wherein:
the output transistor is arranged such that a gate-source voltage of the output transistor corresponds to a drain-source voltage of the output current source transistor; and a threshold voltage of the intermediate current source transistor is substantially equal to a threshold voltage of the intermediate gain transistor.

4. The current sensing circuit of claim 1, wherein a gate and a drain of the input gain transistor are short circuited and coupled to a gate of the intermediate gain transistor.

5. The current sensing circuit of claim 1, wherein:
the gate of the input gain transistor, the gate of the intermediate gain transistor, and the gate of the output gain transistor are directly coupled;
the gate of the intermediate current source transistor and the gate of the output current source transistor are directly coupled; and
the gate of the intermediate current source transistor is coupled to the drain of the intermediate current source transistor.

6. The current sensing circuit of claim 1, wherein the transistors are metal oxide semiconductor field effect transistors.

7. The current sensing circuit of claim 1, wherein the gain transistors are P channel transistors and the current source transistors are N-channel transistors.

8. The current sensing circuit of claim 2, wherein the gain transistors are P-channel transistors and the output transistor is an N channel transistor.

9. The current sensing circuit of claim 1, further comprising:
a current source configured to provide a pre-determined current; and
a mirror transistor arranged in series with the current source, such that the mirror transistor is traversed by the pre-determined current, and forming a current mirror with the input current source transistor, thereby providing the bias current.

* * * * *